US007474115B1

(12) United States Patent
Trujillo et al.

(10) Patent No.: US 7,474,115 B1
(45) Date of Patent: Jan. 6, 2009

(54) ORGANIC ELECTRONIC DEVICE DISPLAY DEFECT DETECTION

(75) Inventors: Johann Thomas Trujillo, Goleta, CA (US); Ian D. Parker, Santa Barbara, CA (US); Andrew Wesley Johnson, Santa Barbara, CA (US); Lingling Wu, Santa Barbara, CA (US); Dmitry Kolosov, Goleta, CA (US); John Penczek, Santa Barbara, CA (US)

(73) Assignee: Dupont Displays, Inc., Santa Barbara, CA (US)

( * ) Notice: Subject to any disclaimer, the term of this patent is extended or adjusted under 35 U.S.C. 154(b) by 0 days.

(21) Appl. No.: 11/303,393

(22) Filed: Dec. 16, 2005

Related U.S. Application Data

(60) Provisional application No. 60/639,679, filed on Dec. 28, 2004.

(51) Int. Cl.
*G01R 31/26* (2006.01)

(52) U.S. Cl. ...................................... 324/767; 324/770

(58) Field of Classification Search ................ 324/770, 324/767
See application file for complete search history.

(56) References Cited

U.S. PATENT DOCUMENTS

| | | | | |
|---|---|---|---|---|
| 3,510,775 | A * | 5/1970 | Orloff | 324/767 |
| 3,534,262 | A * | 10/1970 | Biros | 324/767 |
| 4,520,312 | A * | 5/1985 | Tarng et al. | 324/760 |
| 4,713,819 | A * | 12/1987 | Yoshikawa | 372/9 |
| 4,759,072 | A | 7/1988 | Yamane et al. | 382/8 |
| 5,032,727 | A | 7/1991 | Cox, Jr. et al. | 250/330 |
| 5,057,775 | A * | 10/1991 | Hall | 324/770 |
| 5,111,137 | A * | 5/1992 | Heumann et al. | 324/767 |
| 5,309,108 | A * | 5/1994 | Maeda et al. | 324/501 |
| 5,834,661 | A * | 11/1998 | Nonaka et al. | 73/866 |
| 6,111,424 | A * | 8/2000 | Bosacchi | 324/770 |
| 6,271,520 | B1 | 8/2001 | Tao et al. | 250/330 |
| 6,485,872 | B1 | 11/2002 | Rosenthal et al. | 430/30 |
| 6,545,500 | B1 * | 4/2003 | Field | 324/770 |
| 6,714,017 | B2 | 3/2004 | Enachescu et al. | 324/501 |
| 6,815,975 | B2 * | 11/2004 | Nara et al. | 324/770 |
| 6,840,666 | B2 * | 1/2005 | Enachescu et al. | 374/5 |
| 7,042,162 | B2 * | 5/2006 | Yamazaki et al. | 315/169.1 |
| 2002/0018510 | A1 | 2/2002 | Murphy et al. | 374/45 |
| 2002/0093354 | A1 | 7/2002 | Enachescu et al. | 324/760 |
| 2002/0167987 | A1 | 11/2002 | Schlagheck et al. | 374/5 |

(Continued)

FOREIGN PATENT DOCUMENTS

| | | |
|---|---|---|
| WO | WO 02/45277 A2 | 6/2002 |

OTHER PUBLICATIONS

Zhou, X. et al., "Real-Time Observation of Temperature Rise and Thermal Breakdown Processes in Organic LEDs Using an IR Imaging and Analysis System", *Adv. Matter,* 2000, 12(4), 265-269.

*Primary Examiner*—Ha Tran T Nguyen
*Assistant Examiner*—Richard Isla Rodas
(74) *Attorney, Agent, or Firm*—Woodcock Washburn LLP

(57) ABSTRACT

Defects are detected in organic electronic device displays such as organic light emitting diode (OLED) displays. An infrared camera may be used to screen displays for defects and to identify the locations of the defects. Relative hot or cold areas in a display correspond to defects and can be detected using the infrared camera.

18 Claims, 3 Drawing Sheets

U.S. PATENT DOCUMENTS

2002/0180926 A1 12/2002 Mizumura et al. .......... 349/192
2003/0137628 A1 7/2003 Nagaoka ..................... 349/141
2004/0028113 A1 2/2004 Schlagheck et al. ........... 374/57
2004/0048113 A1 3/2004 Murphy et al. ................ 429/13
2005/0212730 A1 * 9/2005 Sato et al. ..................... 345/76

* cited by examiner

ORGANIC ELECTRONIC DEVICE DISPLAY DEFECT DETECTION

CROSS REFERENCE

This application claims benefit to U.S. Provisional Application Ser. No. 60/639,679 filed Dec. 28, 2004, the disclosure of which is incorporated herein by reference in its entirety.

FIELD

This disclosure relates generally to organic electronic device displays and more specifically to detecting defects in organic electronic device displays.

BACKGROUND

Organic electronic devices convert electrical energy into radiation, detect signals through electronic processes, convert radiation into electrical energy, or include one or more organic semiconductor layers. Organic electronic devices, such as organic light emitting diodes (OLEDs), hold great promise for future use as large area flat panel displays. The fabrication of such displays is occasionally plagued by process irregularities. Some of these irregularities can eventually manifest themselves as defects that limit the life or acceptability of a display. Defects such as leakage currents or short circuits are common problems during the operation of organic electronic devices, which result in thermal breakdown and catastrophic failure of the devices.

Detecting a defect by waiting for a shorted pixel to occur and then performing failure analysis to determine the cause is not desirable. At least two problems exist with this technique. If there are multiple imperfections within the display, determining which imperfection caused the fatal defect is time consuming and expensive. Moreover, even if the responsible defect site is located, inconclusive results would likely result because the site will be carbonized or otherwise destroyed from the high amount of heat.

SUMMARY

In one embodiment, defects are detected in organic electronic device displays such as organic light emitting diode (OLED) displays. An infrared camera may be used to screen displays for defects and to identify the locations of the defects. Relative hot or cold areas in a display correspond to defects and can be detected using the infrared camera. Such locations can be mapped for subsequent failure analysis.

In general, the invention features a method for detecting a defect by applying a bias to an organic electronic device display, and identifying a defect on the organic electronic device display in response to the bias. An example of an organic electronic device that may be used in accordance with the invention is an OLED.

According to aspects of the invention, the bias may be a reverse bias that is less than some threshold that causes damage. An example reverse bias threshold is 10 volts. Moreover, identifying the defect may include detecting a leakage current or a short circuit on the organic electronic device display. The leakage current or short circuit may be localized to at least one pixel. Identifying the defect may be performed with sub-pixel spatial resolution or intrapixel resolution. Furthermore, identifying the defect may be performed by monitoring the temperature across the organic electronic device display for a change in temperature that corresponds to the defect. An infrared camera may be used to monitor the organic electronic device display.

According to further aspects of the invention, applying the bias may include applying less than a threshold and then, in the absence of a defect, increasing the bias to above the threshold. The application of the bias and subsequent identification of a defect may be performed at room temperature. The organic electronic device display may be heated or cooled to enhance observation of a defect.

In another embodiment, the invention features a method for detecting a defect by applying a bias to an organic electronic device display, identifying a short or leakage current in a pixel in the organic electronic device display, and locating a defect within the pixel. The short or leakage current may be identified by visual inspection or by infrared scanning the organic electronic device display.

According to aspects of the invention, locating the defect within the pixel may involve the use of an infrared camera. Infrared scanning can include identifying the short or leakage current by low magnification infrared scanning, and locating the defect within the pixel by high magnification infrared scanning.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

The figures are provided by way of example and are not intended to limit the invention. Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

The present invention is directed to detecting defects in organic electronic device displays such as organic light emitting diode (OLED) displays. An infrared camera may be used to screen displays for defects and to identify the locations of the defects. Relative hot or cold areas in a display correspond to defects and can be detected using the infrared camera. Such locations can be mapped for subsequent failure analysis.

Quick, non-destructive systems and methods are needed to screen organic electronic device displays for such defects to ensure product reliability. The screening techniques would be of even greater value if the location of the defects could be identified for subsequent failure analysis.

Other features and advantages of the invention will be apparent from the following detailed description, and from the claims.

Figure 1:
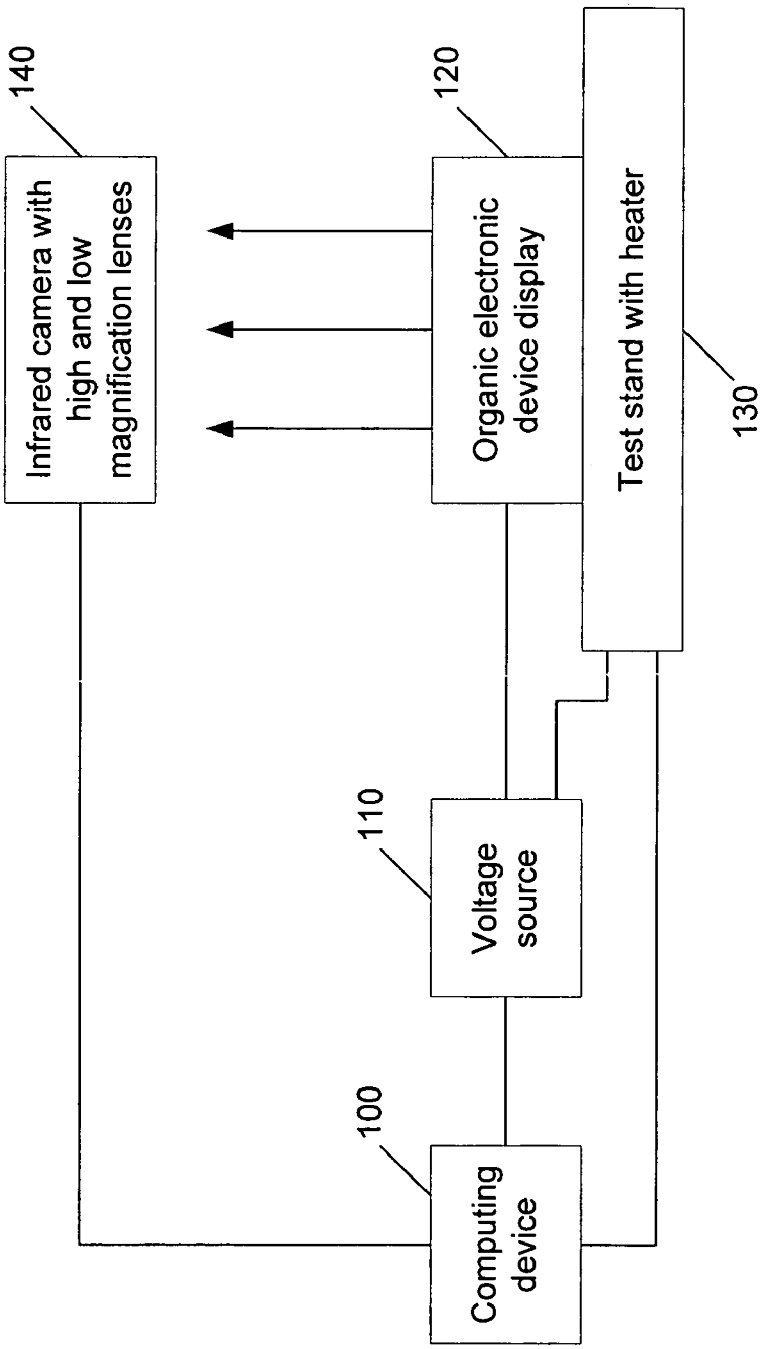
FIG. 1 is a block diagram of an exemplary defect detection system in accordance with the present invention.

FIG. 1 is a block diagram of an exemplary defect detection system in accordance with the present invention. A computing device 100, such as a personal computer, is adapted to control various components of the defect detection system, such as a voltage source 110, a test stand 130, and an infrared camera 140. The computing device controls these components (e.g., pursuant to commands provided by a user or software loaded thereon) and records measurements and other parameters and characteristics of the system and the organic electronic device display 120 that is being tested.

The voltage source 110 is a device that is operable to impress a potential difference and is coupled to the display 120 to provide a bias to the display. The infrared camera 140 is desirably used to detect a defect in the display 120. A defect, such as a high leakage path or short, may be viewed or otherwise detected via the infrared camera 140 when the display 120 is running in with a bias, and desirably a reverse bias of less than a predetermined threshold. It is contemplated that a low reverse bias is used initially, and the reverse bias is increased as desired to further detect or locate a defect.

When the display 120 is reverse biased, current will flow, and the display 120 does not light up. Heat is detected by the infrared camera 140. The infrared image from the camera 140 may be illuminated, but not the display 120 itself. A leak is considered to be a defect within a pixel. A pixel defect includes a "pixel short" and a "dim pixel". A pixel short appears as a dark pixel and in a passive matrix device, the column containing the pixel will be brighter compared to the rest of the display. A dim pixel is similar to a pixel short except the pixel is still emitting light. If a dim pixel can be detected on a device, it may be marked, noted, and turned off. A dim pixel is at a fragile stage and excess running can cause it to become a permanent short. After the defect location is known, it can be further examined with a high magnification infrared camera, or the infrared camera can be set to a higher magnification, and a sub-pixel infrared image can be obtained with minimal "on time" for display.

More particularly, the illumination associated with a pixel defect may be coarsely detected by visual inspection and/or by the use of a camera, such as scanning the display with an infrared camera 140. The camera 140 desirably has a bandpass of about 2.5 to 5 μm. Such a bandpass will desirably filter unrelated, undesired, and/or stray light that is unrelated to a defect. The infrared radiance produced inside the working display passes through the organic electronic device and is detected by the infrared camera. Thus, any pixel that has a leak will locally heat up and produce a signal on the infrared image obtained by the camera 140. These leaks can then be further identified and their locations more accurately pinpointed, e.g., by using a higher magnification on the infrared camera 140, to within a particular pixel or set of pixels. It is contemplated that background subtraction may be used to accentuate the defects. Such defects can be located and separated for failure analysis.

The test stand 130 is adapted to receive the display 120 being tested. Adding external heat to the display 120 makes the defects easier to detect. Accordingly, optionally, the test stand 130 comprises a heater for heating the display 120. It may be desirable to heat the display, for example, to allow a more precise identification and/or location of a defect in the display 120. A hot plate may be used such that a balance of the combination of heat and voltage is obtained to give a minimum detectable temperature change. Excessive heat should not be applied, nor should excessive current be passed through the device, in order to avoid damaging the defect site if it is desirable to perform further failure analysis.

The infrared camera 140 desirably has a low magnification lens and a high magnification lens. Low magnification is used to initially detect and identify a coarse location of a defect, such as a pixel short. High magnification is then desirably used to more precisely identify and locate the defect. Low magnification and high magnification may be used in sequence. The infrared camera detects changes in temperature across the display, and desirably the camera can detect changes in display or pixel temperature of about 0.2 degrees C. or greater, for example, although this temperature difference may change based on the equipment being used. These detected temperature differences may then be associated with a defect or defects. Desirably, testing for defects is performed at room temperature. The camera may calibrate the temperature of the display prior to attempting to detect any defects. The camera may then compare the present temperature of the display, at the point it is scanning, to the stored calibrated temperature of the display. If this comparison is greater than a threshold, such as 0.2 degrees C., then it is determined that a defect may be present at that point of the display.

The thermal environment is desirably controlled for infrared reflections. Off-angle viewing is desirably performed in which the camera is pointed away from itself to avoid measuring the heat reflected from the camera. The camera can be moved to pinpoint a particular spot on the display.

Figure 2:
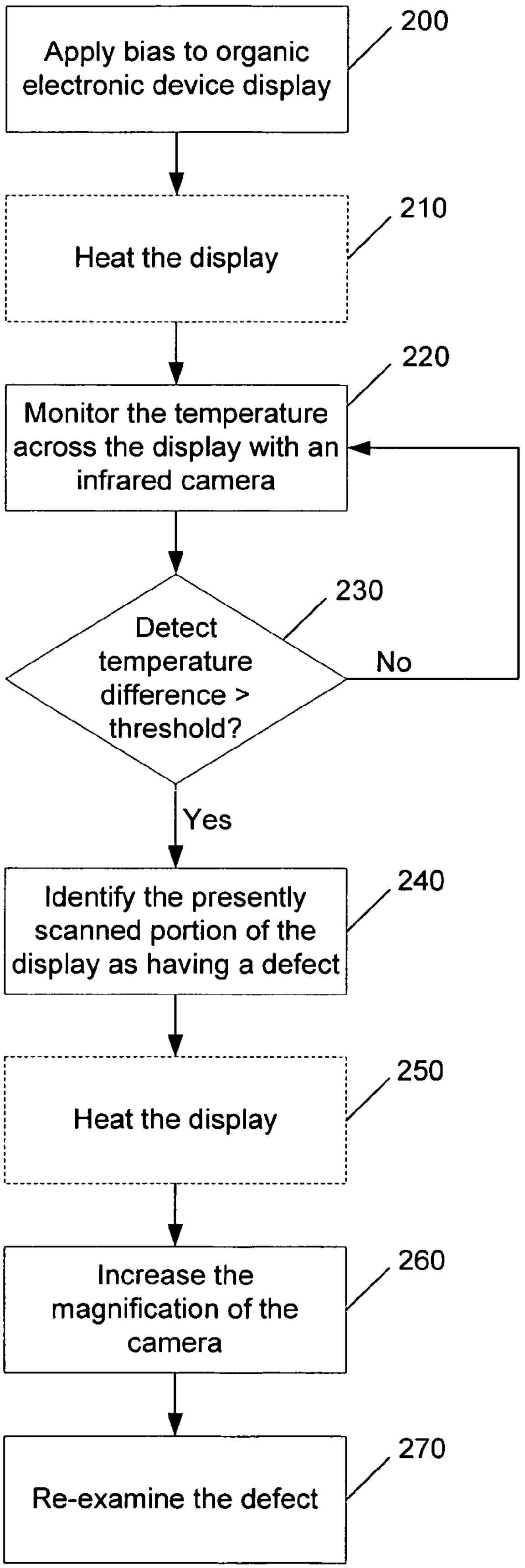
FIG. 2 is a flow diagram of an exemplary method of detecting a defect in accordance with the present invention.

FIG. 2 is a flow diagram of an exemplary method of detecting a defect in accordance with the present invention. At step 200, a bias, such as a reverse bias, is applied to an organic electronic device display, such as an OLED display, via a voltage source for example. At optional step 210, the display is heated externally and uniformly (e.g., using a heater coupled to the test stand to which the display is mounted). As described above, heating the display may help to make a defect more pronounced, and thus, easier to detect, or otherwise further isolate the defect.

The display is then scanned with an infrared camera to detect a defect, such as a short, leakage current, or other pixel defect. The infrared camera may be set at a low or coarse magnification level. More particularly, at step 220, a defect may be detected by monitoring the temperature across the display with the infrared camera. If a temperature difference above a certain threshold (e.g., 0.2 degrees C.) is detected at step 230, then that spot of the display is noted as containing a defect, at step 240. Otherwise, if no temperature difference above the predetermined threshold is detected at step 230, then the camera scans to a different portion of the display and processing returns to step 220.

Processing may stop at 240, or it may continue with another pass over the defect area(s), for example, with a higher magnification lens or setting on the infrared camera. In such a case, the display may be heated at step 250 (optional), and the magnification of the camera is increased at step 260. The defect is then re-examined at step 270. In this manner, the defect may be more precisely identified and located. For example, the defect may be isolated to within a pixel (e.g., at the sub-pixel level or intrapixel level).

Figure 3:
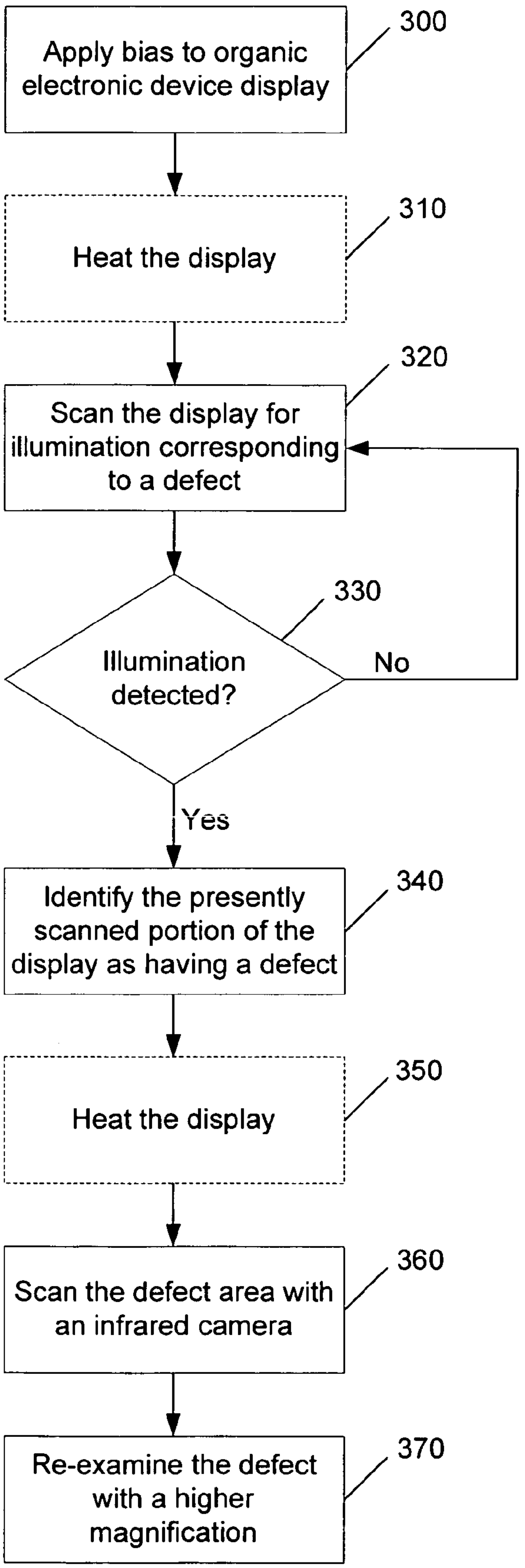
FIG. 3 is a flow diagram of another exemplary method of detecting a defect in accordance with the present invention.

FIG. 3 is a flow diagram of another exemplary method of detecting a defect in accordance with the present invention. Steps 300 and 310 are similar to steps 200 and 210 and their description is omitted for brevity. At step 320, the display is scanned, either visually or using a camera or microscope for example, to detect an illumination which corresponds to a defect. If an illumination is detected at step 330, then that spot of the display is noted as containing a defect, at step 340. Otherwise, if no illumination is detected at step 330, then visual and/or machine scanning continues on a different portion of the display and processing returns to step 320.

Processing may stop at 340, or it may continue with another pass over the defect areas, for example, with an infrared camera to more precisely identify and locate the defect. In such a case, the display may be heated at optional step 350, and the defect area is scanned at step 360. The magnification of the camera may be increased at step 370, with the defect being re-examined at this high magnification, if desired.

Thus, the defect may be isolated to within a pixel (e.g., at the sub-pixel level or intrapixel level). Steps 360 and 370 may be repeated as desired.

The concepts described herein will be further described in the following examples, which do not limit the scope of the invention described in the claims.

Exemplary infrared cameras that may be used with the invention are the "Micron" infrared camera and the "Merlin" infrared camera, both manufactured by FLIR Systems, Indigo Operations, Goleta, Calif.

An exemplary OLED that may be used with the invention is a display device that sandwiches organic layers between two electrodes. The organic films consist of a hole-injection layer, a hole-transport layer, an emissive layer and an electron-transport layer. When voltage is applied to the OLED cell, the injected positive and negative charges recombine in the emissive layer and create electro luminescent light. OLED displays are emissive devices in that they emit light rather than modulate transmitted or reflected light.

Certain OLED display defects create temperature differences between the defective area and its surroundings. Relative hot or cold areas in a display can be detected using an infrared camera, and defect locations can then be mapped. For example, this can be the case for displays that have an area with current leakage, a short circuit, or an open circuit. In a display that has current leakage, the leaky region will be slightly hotter than its surroundings due to Joule heating. An infrared camera can observe this relatively hot region. Similarly, a display with a shorted area would exhibit a hot spot. In contrast, an infrared camera could also detect an open circuit region that would be cooler relative to its surroundings. This process can be used to detect defects in both the light-emitting region and its passive/active electrical components. The precision at which the defect is spatially located is dependent on the magnification of the thermal image, as well as the thermal conductivity of the display substrate, for example.

An infrared camera allows for quick defect screening of multiple displays simultaneously in a manufacturing environment. With sufficient camera sensitivity, the infrared camera method can detect hot regions within a display that are likely to have a high rate of infant mortality. These latent defects can be missed with a camera that is only sensitive to visible light. Techniques involving an infrared camera in accordance with the invention are non-destructive and do not require contacts or electronics other than those used for manufacturing testing. When high magnification optics are utilized, the defect areas can be more precisely located for subsequent characterization. Furthermore, applying external heat to the device will accentuate the defective site allowing it to be more easily detected by the infrared camera. It is contemplated that the device may be cooled to preserve the defect for subsequent failure analysis.

Thus, an effective failure analysis tool is enabled by providing sub-pixel spatial resolution or intrapixel resolution to detect small defects capable of influencing the performance of an organic electronic device display. The detection process is non-destructive. Potential pixel failures can be predicted during the manufacturing inspection.

In an effort to clarify the meanings of terms used in this application, the following definitions apply where the specified terms are used.

As used herein, the term "computing device" means any general purpose or specialized computing system and may include a conventional personal computer or the like, including a processing unit, a system memory, and a system bus that couples various system components including the system memory to the processing unit. The system bus may be any of several types of bus structures including a memory bus or memory controller, a peripheral bus, and a local bus using any of a variety of bus architectures. The system memory includes read only memory (ROM) and random access memory (RAM). A basic input/output system, containing the basic routines that help to transfer information between elements within the personal computer, such as during start up, is stored in ROM.

The personal computer may further include a hard disk drive for reading from and writing to a hard disk, a magnetic disk drive for reading from or writing to a removable magnetic disk, and an optical disk drive for reading from or writing to a removable optical disk such as a CD-ROM or other optical media. The drives and their associated computer readable media provide nonvolatile storage of computer readable instructions, data structures, program modules, and other data for the personal computer.

A number of program modules may be stored on the hard disk, magnetic disk, optical disk, ROM or RAM, including an operating system, one or more application programs, other program modules, and program data. A user may enter commands and information into the personal computer through input devices such as a keyboard and a pointing device. A monitor or other type of display device is also connected to the system bus via an interface, such as a video adapter. In addition to the monitor, personal computers typically include other peripheral output devices, such as speakers and printers.

The personal computer may operate in a networked environment using logical connections to one or more remote computers, such as a remote computer. The remote computer may be another personal computer, a server, a router, a network PC, a peer device or other common network node, and typically includes many or all of the elements described above relative to the personal computer.

While it is envisioned that numerous embodiments of the present invention are particularly well-suited for computerized systems, nothing in this document is intended to limit the invention to such embodiments. On the contrary, as used herein the term "computing device" is intended to encompass any and all devices comprising press buttons, or capable of determining button presses, or the equivalents of button presses, regardless of whether such devices are electronic, mechanical, logical, or virtual in nature.

As used herein, the term "defect" means an imperfection, failing, or deficiency in a device or display. Defects include, but are not limited to pixel defects, short circuits, leakage currents, and open circuits.

The term "organic electronic device" is intended to mean a device including one or more semiconductor layers or materials. Organic electronic devices include, but are not limited to: (1) devices that convert electrical energy into radiation (e.g., a light-emitting diode, light emitting diode display, diode laser, or lighting panel), (2) devices that detect signals through electronic processes (e.g., photodetectors photoconductive cells, photoresistors, photoswitches, phototransistors, phototubes, infrared ("IR") detectors, or biosensors), (3) devices that convert radiation into electrical energy (e.g., a photovoltaic device or solar cell), and (4) devices that include one or more electronic components that include one or more organic semiconductor layers (e.g., a transistor or diode). The term device also includes coating materials for memory storage devices, antistatic films, biosensors, electrochromic devices, solid electrolyte capacitors, energy storage devices such as a rechargeable battery, and electromagnetic shielding applications.

The term "organic electronic device display" means a device, apparatus, or system that comprises an organic electronic device and is meant to convey or represent information in visual form.

The term "connected," with respect to electronic components, circuits, or portions thereof, is intended to mean that two or more electronic components, circuits, or any combination of at least one electronic component and at least one circuit do not have any intervening electronic component lying between them. Parasitic resistance, parasitic capacitance, or both are not considered electronic components for the purposes of this definition. In one embodiment, electronic components are connected when they are electrically shorted to one another and lie at substantially the same voltage. Note that electronic components can be connected together using fiber optic lines to allow optical signals to be transmitted between such electronic components.

The term "coupled" is intended to mean a connection, linking, or association of two or more electronic components, circuits, systems, or any combination of at least two of: (1) at least one electronic component, (2) at least one circuit, or (3) at least one system in such a way that a signal (e.g., current, voltage, or optical signal) may be transferred from one to another. Non-limiting examples of "coupled" can include direct connections between electronic components, circuits or electronic components with switch(es) (e.g., transistor(s)) connected between them, or the like.

The term "emit," when referring to a radiation-emitting electronic component, is intended to mean the emanation of radiation at a targeted wavelength or spectrum of wavelengths from such radiation-emitting electronic component.

The term "filter" when referring to a layer or material is intended to mean a layer or material separate from a radiation-emitting or radiation-sensing layer, wherein the filter is used to limit the wavelength(s) of radiation passing through such layer or material. For example, a red filter layer may allow substantially only red light from the visible light spectrum to pass through the red filter layer. Therefore, the red filter layer filters out green light and blue light.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components of the invention. This is done merely for convenience and to give a general sense of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Many aspects and embodiments have been described above and are merely exemplary and not limiting. After reading this specification, skilled artisans appreciate that other aspects and embodiments are possible without departing from the scope of the invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

The invention claimed is:

1. A method for detecting a defect, the method comprising:

applying a reverse bias to an organic electronic device display comprising a plurality of pixels;

determining whether a defect is present in the organic electronic device display in response to the applied reverse bias;

increasing the applied reverse bias if the defect is not detected; and identifying the defect on the organic electronic device display in response to the increased reverse bias.

2. The method of claim 1, wherein identifying the defect comprises detecting a leakage current or a short or open circuit on the organic electronic device display.

3. The method of claim 2, further comprising localizing the leakage current or short circuit to at least one of the plurality of pixels.

4. The method of claim 1, wherein identifying the defect is performed with sub-pixel spatial resolution.

5. The method of claim 1, wherein identifying the defect comprises monitoring the temperature across the organic electronic device display for a change in temperature, the change in temperature corresponding to the defect.

6. The method of claim 1, wherein applying the reverse bias comprises applying less than a predetermined threshold, and wherein increasing the applied reverse bias comprises increasing the applied reverse bias to above the predetermined threshold.

7. The method of claim 1, wherein identifying the defect comprises monitoring the organic electronic device display with an infrared camera.

8. The method of claim 1, further comprising applying external heat to the organic electronic device display.

9. The method of claim 1, wherein the organic electronic device display is an organic light emitting diode (OLED).

10. A method for detecting a defect, the method comprising:

applying a reverse bias to an organic electronic device display comprising a plurality of pixels;

determining whether a defect is present in the organic electronic device display in response to the applied reverse bias;

increasing the applied reverse bias if the defect is not detected;

identifying a short or leakage current in at least one of the plurality of pixels in the organic electronic device display in response to the increased reverse bias; and locating the defect within the at least one of the plurality of pixels.

11. The method of claim 10, wherein identifying the short or leakage current comprises identifying the short or leakage current by visual inspection or by infrared scanning the organic electronic device display.

12. The method of claim 10, wherein locating the defect within the at least one of the plurality of pixels comprises locating the defect with an infrared camera.

13. The method of claim 10, wherein identifying the short or leakage current comprises low magnification infrared scanning, and locating the defect within the at least one of the plurality of pixels comprises high magnification infrared scanning.

14. The method of claim 10, wherein identifying the short or leakage current comprises monitoring the temperature across the organic electronic device display for a change in temperature, the change in temperature corresponding to the short or leakage current.

15. The method of claim 10, wherein the organic electronic device display is an organic light emitting diode (OLED).

16. A defect detection system comprising:

a module that receives an organic electronic device display;

a device connected to the organic electronic device display such that the device is operable to apply a reverse bias to the organic electronic device display, wherein the device is further operable to increase the applied reverse bias if a defect is not detected; and an infrared camera to identify the defect in the organic electronic device display.

17. The system of claim 16, wherein the organic electronic device display is an organic light emitting diode (OLED).

18. The system of claim 16, wherein the module is further configured to apply external heat to the organic electronic device display.

* * * * *